(12) United States Patent
Usui et al.

(10) Patent No.: US 8,728,232 B2
(45) Date of Patent: *May 20, 2014

(54) SINGLE CRYSTAL HEAT TREATMENT METHOD

(75) Inventors: Tatsuya Usui, Hitachinaka (JP); Naoaki Shimura, Hitachinaka (JP); Yasushi Kurata, Hitachinaka (JP); Kazuhisa Kurashige, Hitachinaka (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 491 days.

This patent is subject to a terminal disclaimer.

(21) Appl. No.: 11/374,436

(22) Filed: Mar. 14, 2006

(65) Prior Publication Data

US 2006/0266277 A1 Nov. 30, 2006

(30) Foreign Application Priority Data

May 27, 2005 (JP) ................. P2005-155871
Aug. 31, 2005 (JP) ................. P2005-251886

(51) Int. Cl.
*C30B 15/14* (2006.01)
*C30B 21/06* (2006.01)

(52) U.S. Cl.
USPC .......... 117/3; 117/11; 117/13; 117/906; 117/944

(58) Field of Classification Search
USPC ................... 117/3, 11, 13, 906, 944
See application file for complete search history.

(56) References Cited

U.S. PATENT DOCUMENTS

| 4,958,080 | A | 9/1990 | Melcher |
| 5,264,154 | A | 11/1993 | Akiyama et al. |
| 5,728,213 | A | 3/1998 | Kurata et al. |
| 6,278,832 | B1 | 8/2001 | Zagumennyi et al. |
| 7,084,403 | B2 * | 8/2006 | Srivastava et al. ........ 250/361 R |

FOREIGN PATENT DOCUMENTS

| JP | 2-64008 A | 3/1990 |
| JP | 2852944 B2 | 9/1990 |
| JP | 7-78215 B2 | 8/1992 |
| JP | 4-321600 A | 11/1992 |
| JP | 6-100360 A | 4/1994 |
| JP | 09-157090 | * 6/1997 |
| JP | 2701577 B2 | 10/1997 |
| JP | 2701577 | * 1/1998 |
| JP | 2001-524163 A | 11/2001 |
| JP | 2007-1850 A | 1/2007 |

OTHER PUBLICATIONS

U.S. Appl. No. 11/374,435, Shimura et al., filed Mar. 14, 2006.*
U.S. Appl. No. 11/755,787, Usui, filed May 31, 2007.*
U.S. Appl. No. 11/806,257, Shimura et al.i, filed May 30, 2007.*
Loutts et al., Czochralski growth and characterization of (Lu1-xGdx)2SiO5 single crystals for scintillators, Journal of crystal growth 174 (1997) p. 331-336.*
English abstract and translation of JP 2701577B2.*
Japanese Office Action dated May 25, 2010 (mailing date), issued in Japanese Patent Application No. 2005-251886.

* cited by examiner

*Primary Examiner* — Matthew Song
(74) *Attorney, Agent, or Firm* — Westerman, Hattori, Daniels & Adrian, LLP

(57) ABSTRACT

A single crystal heat treatment method having a step of heating a single crystal of a specific cerium-doped silicate compound in an oxygen-poor atmosphere at a temperature $T_1$ (units: °C.) that satisfies the conditions represented by formula (3) below $$800 \leq T_1 < (T_{m1} - 550) \quad (3)$$

(wherein $T_{m1}$ (units: °C.) represents the melting point of the single crystal).

8 Claims, 1 Drawing Sheet

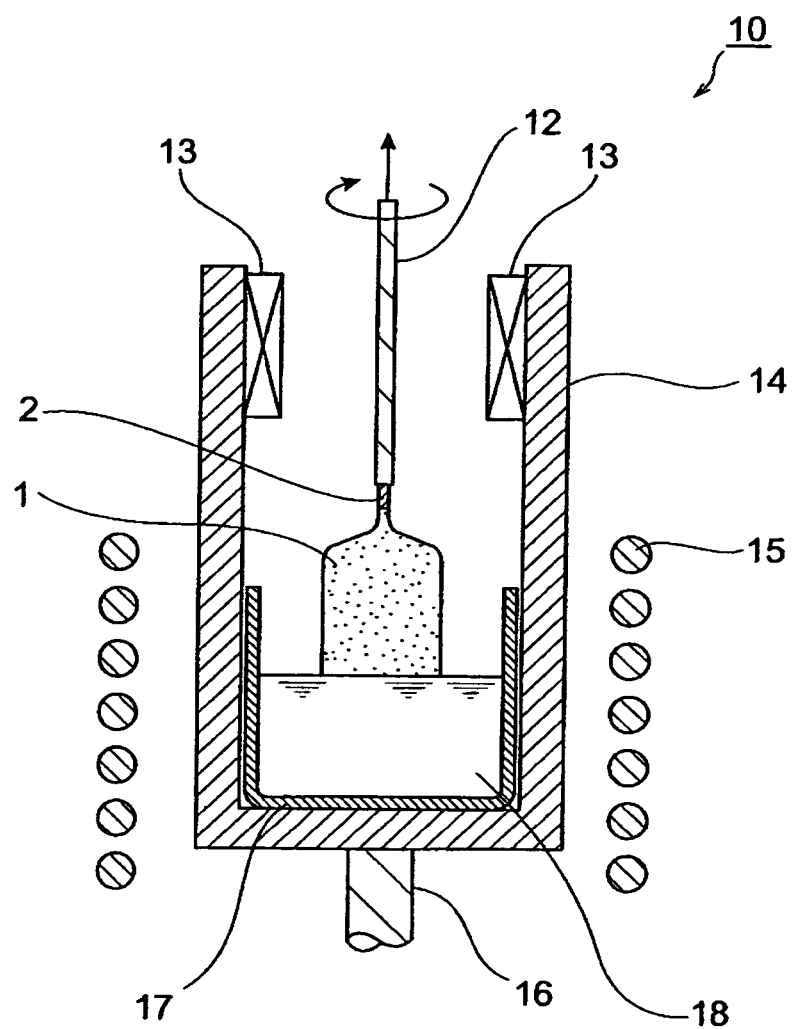

SINGLE CRYSTAL HEAT TREATMENT METHOD

BACKGROUND OF THE INVENTION

1. Field of the Invention

The present invention relates to a single crystal heat treatment method; and more specifically, it relates to a heat treatment method for a single crystal used in a single crystal scintillation detector (scintillator) for detecting radiation such as gamma radiation and the like in fields such as radiology, physics, physiology, chemistry, mineralogy, and oil exploration, including medical diagnostic positron CT (PET) scanning, observation of cosmic rays, and exploration for underground resources.

2. Related Background of the Invention

Because scintillators that use cerium-doped gadolinium orthosilicate compounds have a short fluorescent decay time and also a large radiation absorption coefficient, they have found applications as radiation detectors for positron CT and the like. The light output of these scintillators is greater than that of BGO scintillators, but only about 20% of the light output of NaI (Tl) scintillators, and further improvement is needed in that area.

Recently, scintillators using single crystals of cerium-doped lutetium orthosilicate, which are generally represented by the formula $LU_{2(1-x)}Ce_{2x}SiO_5$, have been disclosed (Japanese Patent Registration Number 2852944, and U.S. Pat. No. 4,958,080). In addition, scintillators using single crystals of the compound represented by the general formula $Gd_{2-(x+y)}Ln_xCe_ySiO_5$ (wherein Ln represents Lu or a species of rare earth element) have been disclosed (see Japanese Patent Application Laid-open No. 7-78215 and U.S. Pat. No. 5,264,154). It is known that in these scintillators not only is the crystal density increased, but also the light output of cerium-doped orthosilicate single compounds crystals is increased, and the fluorescent decay time can be shortened.

Furthermore, Japanese Patent Registration No. 2701577 discloses a heat treatment method that increases scintillator properties such as light output and energy resolution capability and the like of single crystals of cerium-doped gadolinium orthosilicate compounds. This heat treatment method is one wherein a heat treatment is performed in an oxygen-poor atmosphere at a high temperature (a temperature ranging from 50° C. to 550° C. lower than the melting point of the single crystal). According to this document, scintillation properties are increased by an effect wherein tetravalent cerium ions, which are an impediment to scintillation luminescence, are reduced to a trivalent state.

SUMMARY OF THE INVENTION

However, the single crystals of cerium-doped orthosilicate compounds disclosed in the above document tend to have a high light output background. This results in problems such as variation in fluorescent properties both within and between crystal ingots; in other words, day-to-day variations and time-course changes due to exposure to natural light, including ultraviolet light, occur frequently, and it is very difficult to obtain stable light output properties.

In addition, among the single crystals of cerium-doped silicate compounds, it has become clear that when single crystals of the cerium-doped silicate compounds represented by general formulas (1), (2), and (6) below are grown or cooled in an oxygen-poor atmosphere, or heated at high temperatures in an oxygen-poor atmosphere after single crystal growth, the light output background rises, and there is a greater drop-off in light output and greater variation in fluorescent properties.

$$Y_{2-(x+y)}Ln_xCe_ySiO_5 \tag{1}$$

(wherein Ln represents at least one elemental species selected from a group consisting of elements belonging to the rare earth elements, x represents a numerical value from 0 to 2, and y represents a numerical value greater than 0 but less than or equal to 0.2)

$$Gd_{2-(z+w)}Lu_zCe_wSiO_5 \tag{2}$$

(wherein Ln represents at least one elemental species selected from a group consisting of elements belonging to the rare earth elements, z represents a numerical value greater than 0 but less than or equal to 2, and w represents a numerical value greater than 0 but less than or equal to 0.2)

$$Gd_{2-(r+s)}Lu_rCe_sSiO_5 \tag{6}$$

(wherein r represents a numerical value greater than 0 but less than or equal to 2, and s represents a numerical value greater than 0 but less than or equal to 0.2)

This tendency becomes particularly pronounced with a single crystal having as Ln at least one elemental species selected from a group consisting of Dy, Ho, Er, Tm, Yb, Lu, Y and Sc, which have an ionic radius smaller than Tb.

Moreover, satisfactory results can be obtained with the heat treatment method disclosed in Japanese Patent Registration Number 2701577 when it is used on a single crystal of $Gd_{2(1-x)}Ce_{2x}SiO_5$ (cerium-doped gadolinium orthosilicate). However, when this heat treatment is used with single crystals of the cerium-doped silicate compounds represented by general formula (1) above or with single crystals of the cerium-doped gadolinium silicates compounds represented by general formulas (2) and (6) above, the light output background increases. As a result, it has been learned that this heat treatment results in negative effects of a greater drop-off in light output and greater variation in light output. This tendency becomes particularly pronounced with a single crystal having as Ln at least one elemental species selected from a group consisting of Dy, Ho, Er, Tm, Yb, Lu, Y and Sc, which have an ionic radius smaller than Tb.

Furthermore, there is a method wherein specific cerium-doped silicate single crystals are grown or cooled in an oxygen-containing atmosphere (for example, an atmosphere wherein the oxygen concentration is 0.2 vol % or higher), and then a high-temperature heat treatment is performed on those single crystals in an oxygen-containing atmosphere; however, it has become clear that such a method brings about a drop-off in light output due to coloration of the crystal, absorption of fluorescent and the like.

Thus, upon taking into account the above circumstances, an object of the present invention is to provide a single crystal heat treatment method wherein the rise in the light output background is sufficiently inhibited, and wherein it is possible to sufficiently prevent variation in light output and sufficiently enhance light output properties even in single crystals of the cerium-doped silicate compounds represented by general formulas (1), (2), and (6) above, and especially in single crystals having as Ln at least one elemental species selected from a group consisting of Dy, Ho, Er, Tm, Yb, Lu, Y and Sc, which have an ionic radius smaller than Tb.

The present invention provides a single crystal heat treatment method having a step wherein a single crystal of a cerium-doped silicate compound represented by general formula (1) or (2) below is heated in an oxygen-poor atmosphere at a temperature $T_1$ (units: °C.) that satisfies the conditions represented by formula (3) below $$Y_{2-(x+y)}Ln_xCe_ySiO_5 \quad (1)$$

(wherein Ln represents at least one elemental species selected from a group consisting of elements belonging to the rare earth elements, x represents a numerical value from 0 to 2, and y represents a numerical value greater than 0 but less than or equal to 0.2)

$$Gd_{2-(z+w)}Ln_zCe_wSiO_5 \quad (2)$$

(wherein Ln represents at least one elemental species selected from a group consisting of elements belonging to the rare earth elements, z represents a numerical value greater than 0 but less than or equal to 2, and w represents a numerical value greater than 0 but less than or equal to 0.2)

$$800 \leq T_1 < (T_{m1}-550) \quad (3)$$

(wherein $T_{m1}$ (units: °C.) represents the melting point of the single crystal).

The present invention provides a single crystal heat treatment method having a step wherein a single crystal of a cerium-doped gadolinium silicate compound represented by general formula (4) below is heated in an oxygen-poor atmosphere at a temperature $T_2$ (units: °C.) that satisfies the conditions represented by formula (5) below $$Gd_{2-(p+q)}Ln_pCe_qSiO_5 \quad (4)$$

(wherein Ln represents at least one elemental species selected from a group consisting of Dy, Ho, Er, Tm, Yb, Lu, Y and Sc, which are rare earth elements having an ionic radius smaller than Tb, p represents a numerical value greater than 0 but less than or equal to 2, and q represents a numerical value greater than 0 but less than or equal to 0.2)

$$800 \leq T_2 < (T_{m2}-550) \quad (5)$$

(wherein $T_{m2}$ (units: °C.) represents the melting point of the single crystal).

The present invention provides a single crystal heat treatment method having a step wherein a single crystal of a cerium-doped gadolinium silicate compound represented by general formula (6) below is heated in an oxygen-poor atmosphere at a temperature $T_3$ (units: °C.) that satisfies the conditions represented by formula (7) below $$Gd_{2-(r+s)}Ln_rCe_sSiO_5 \quad (6)$$

(wherein r represents a numerical value greater than 0 but less than or equal to 2, and s represents a numerical value greater than 0 but less than or equal to 0.2)

$$800 \leq T_3 < (T_{m3}-550) \quad (7)$$

(wherein $T_{m3}$ (units: °C.) represents the melting point of the single crystal).

The present invention provides a single crystal heat treatment method wherein the oxygen concentration in the oxygen-poor atmosphere is less than 0.2 vol %, and the concentration of inert gas is greater than 99.8 vol %.

The present invention provides a single crystal heat treatment method wherein the concentration of hydrogen gas as a reducing gas in the oxygen-poor atmosphere is 0.5 vol % or greater.

The present invention provides a single crystal heat treatment method wherein prior to the heating step, the single crystal is grown or cooled in an oxygen-containing atmosphere, or is heated in an oxygen-containing atmosphere.

In accordance with the present invention, a single crystal heat treatment method can be provided wherein the rise in the light output background is sufficiently suppressed, and wherein variation in light output can be sufficiently prevented and light output property can be sufficiently increased even in single crystals of the cerium-doped silicate compounds represented by general formulas (1), (2), and (6) above, and especially in single crystals having as Ln at least one elemental species selected from a group consisting of Dy, Ho, Er, Tm, Yb, Lu, Y, and Sc, which have an ionic radius smaller than Tb.

BRIEF DESCRIPTION OF THE DRAWINGS

FIG. 1 is a typical cross-sectional view illustrating one example of the basic structure of a growing apparatus for growing a single crystal.

DESCRIPTION OF THE PREFERRED EMBODIMENTS

Hereinafter a detailed description of the preferred embodiments of the present invention is provided, but the present invention is by no means limited to the scope presented below.

When single crystals of cerium-doped rare earth orthosilicate compounds are grown or heat-treated in an oxygen-containing atmosphere, trivalent cerium ions, which constitute the luminescent center, are converted to their tetravalent form. It is known that this change causes a reduction in the luminescent center and an increase in fluorescent absorption due to coloration of the crystal, which results in a decrease in light output. This phenomenon tends to be more pronounced as the oxygen concentration in the atmosphere increases and as the heating temperature increases.

In single crystals of specific cerium-doped rare earth orthosilicate compounds the trivalent state of the cerium ions is retained by growing and cooling the crystal in an oxygen-poor atmosphere or by heating it in an oxygen-poor atmosphere. It is believed that a high light output is obtained because the coloration of the crystal is sufficiently inhibited thereby, and absorption of fluorescent due to coloration is sufficiently inhibited. In addition, when single crystals of cerium-doped rare earth orthosilicate compounds are grown and cooled in an atmosphere that contains oxygen, or heated in an oxygen-containing atmosphere, the light output decreases. However, if a heat treatment is subsequently performed in an oxygen-poor atmosphere, the tetravalent cerium ions in the single crystal revert to the trivalent state, which leads to an increase in the luminescent center and decrease in crystal coloration. It is known that the light output is increased thereby because optical transmittance in the crystal is increased. This phenomenon tends to be more pronounced as the oxygen concentration in the atmosphere decreases and also as the concentration in the atmosphere of a reducing gas such as hydrogen and the like increases, or as the heating temperature increases.

In fact, it has been confirmed that good fluorescent properties and an improving effect in fluorescent properties are obtained by the aforementioned crystal growth in an oxygen-poor atmosphere and heat treatment at a high temperature in single crystals of $Gd_{2(1-x)}Ce_{2x}SiO_5$ (cerium-doped gadolinium orthosilicate) and the like. For example, as a single crystal heat treatment method for cerium-doped gadolinium orthosilicate compounds Japanese Patent Registration Number 2701577 discloses a method wherein heat treatment is performed in an oxygen-poor atmosphere at a high temperature (a temperature 50° C. to 550° C. lower than the single crystal melting point).

However, it has become clear that with single crystals of the cerium-doped silicate compounds represented by general formula (1) above and single crystals of the cerium-doped gadolinium orthosilicate compounds represented by general formulas (2) and (6) above, the light output background is increased by growing and cooling the single crystals in the aforementioned oxygen-poor atmosphere or by performing a heat treatment in an oxygen-poor atmosphere. It has also become clear that the negative effect of greater variation in light output results thereby. This tendency is especially pronounced when a single crystal of at least one elemental species selected from a group consisting of Dy, Ho, Er, Tm, Yb, Lu, Y and Sc, which have an ionic radius smaller than Tb, is used as Ln. Moreover, this effect tends to become more pronounced as the oxygen concentration in the atmosphere decreases and as the concentration of a reducing gas such as hydrogen and the like in the atmosphere increases, and as the heating temperature increases.

One possible cause is believed to be that in the aforementioned single crystals an oxygen deficiency is created within the crystal lattice by growing or heat-treating the single crystal in an oxygen-poor atmosphere. It is also believed that an energy trap level is formed by this oxygen deficiency, the light output background, which is attributable to a thermal excitation effect originating therefrom increases, and as a result variation in light output increases.

In cerium-doped orthosilicates this oxygen deficiency tends to occur often in crystal compositions wherein the crystal structure often assumes a C2/c configuration. In the single crystals of the cerium-doped silicate compound represented by general formula (1) above and single crystals of the cerium-doped gadolinium silicate compounds represented by general formulas (2) and (6) above, the crystal structure assumes a P2$_1$/c configuration when at least one elemental species selected from a group consisting of La, Pr, Nd, Pm, Sm, Eu, Ga, and Tb, which are elements having an ionic radius larger than Dy, is selected as Ln. On the other hand, when at least one elemental species selected from a group consisting of Dy, Ho, Er, Tm, Yb, Lu, Y and Sc, which have an ionic radius smaller than Tb, is selected as Ln, the crystal structure readily assumes a C2/c configuration. The aforementioned increase in the light output background and variation in light output often occur in single crystals in which the crystal structure readily assumes a C2/c configuration. It is believed this phenomenon is attributable to the fact that the aforementioned oxygen deficiency occurs more frequently as the difference between the ionic radius of the cerium dopant and that of the aforementioned elements that constitute the orthosilicate compound increases.

In fact, in the case of single crystals of the cerium-doped gadolinium silicate compound represented by general formula (4) above, it has been found that the oxygen deficiency tends to occur more often as the ratio of Ln, which has the smaller ionic radius, increases in the composition. In single crystals of cerium-doped orthosilicate compounds wherein an oxygen deficiency often occurs due to the aforementioned crystal composition, it is believed that the oxygen deficiency occurs more or less often depending on whether heating is performed in a neutral atmosphere or an atmosphere containing a trace amount of oxygen, or whether heating is performed at an even lower temperature.

Furthermore, in single crystals of $Lu_{2(1-x)}Ce_{2x}SiO_5$ (cerium-doped lutetium orthosilicate wherein the crystal structure has a C2/c configuration) it is believed that an oxygen deficiency frequently occurs because there is a large difference in ionic radius between the Lu ions and Ce ions.

In single crystals of the aforementioned cerium-doped orthosilicate compounds, when crystal growth is performed by the Czochralski method, the segregation coefficient of the cerium incorporated into the crystal from the crystal melt becomes markedly smaller as the difference increases between the ionic radius of the structural rare earth element and the ionic radius of cerium. Therefore, it is believed that the variation in crystal light output and background may be caused by the fact that variations in the cerium concentration within the crystal ingot often occur.

The inventors have discovered that the variation in light output attributable to the aforementioned occurrence of an oxygen deficiency can be reduced by performing the heat treatment of single crystals at a temperature that is a certain extent lower than the melting point of the crystal in an oxygen-poor atmosphere. In other words, the inventors discovered that it is possible to inhibit the occurrence of an oxygen deficiency while simultaneously converting tetravalent cerium ions to trivalent ions and increasing light output by heating the aforementioned single crystals in an oxygen-poor atmosphere at a temperature T (units: ° C.) that satisfies the conditions represented in formula (8) below.

$$800 \leq T < (T_m - 550) \quad (8)$$

(wherein $T_m$ (units: ° C.) represents the melting point of the single crystal)

Temperature T preferably ranges from 1000° C. to 1500° C., and a range from 1200° C. to 1400° C. is especially preferred. When temperature T is less than 800° C. the effect of the present invention tends to be insufficient, and when temperature T is $(T_m - 550)$° C. or higher, an oxygen deficiency often occurs.

The preferred oxygen-poor atmosphere is one containing an oxygen concentration of less than 0.2 vol %, with the remainder (greater than 99.8 vol %) being an inert gas. An oxygen concentration of less than 0.1 vol % is more preferred, and one of 300 vol ppm or less is especially preferred. Generally recognized gases such as helium, argon, nitrogen, and the like can be used as the inert gas. When the aforementioned atmosphere contains 0.5 vol % or more of hydrogen gas as a reducing gas, the effect of the present invention is increased, and an atmosphere containing 5 vol % or more of hydrogen gas can provide a particularly pronounced effect in the present invention. When the oxygen concentration is 0.2 vol % or more, the effect of the present invention tends to be insufficient because the conversion from tetravalent cerium ions to trivalent ions is less likely to occur.

With the single crystal heat treatment method for cerium-doped orthosilicate of the present invention, the effect obtained thereby is increased even more when it is applied to single crystals in which the ratio of tetravalent cerium ions is increased because the crystal has been grown or cooled in an oxygen-containing atmosphere, or when it is applied to single crystals in which the ratio of tetravalent cerium ions is enhanced because the crystal has been heated in an oxygen-containing atmosphere. In the crystal compositions represented by general formulas (1), (2), and (6) above, the effect of the present invention is even further increased because as the cerium concentration becomes higher, the concentration of tetravalent cerium ions often increases as well.

A time of 1 to 20 hours is suitable as the time (hereinafter, referred to as the "treatment time") required for the process step of heating (hereinafter, referred to as the "heating step") in the heat treatment method of the present invention for a single crystal with dimensions of 4 mm×6 mm×20 mm. When the treatment time is less than 1 hour, the effect of the present invention often tends to be insufficient. On the other hand, because the effect of the present invention does not increase with a treatment time exceeding 20 hours, such a treatment time tends to be inefficient and uneconomical. However, it is believed that the effect of the present invention is based on the dispersion of elemental oxygen within the crystal lattice as described above. Therefore, the time required to obtain a uniform effect in the entire crystal block is dependent on the crystal size. Because a longer treatment time is required as the crystal size increases, no upper limit to the treatment time can be stipulated. Moreover, the treatment time and temperature T for single crystals of the aforementioned cerium-doped rare earth orthosilicate compounds may require some adjustment. For example, the treatment time may need to be adjusted if the temperature T is near the boundary with the temperature at which the conversion from tetravalent cerium ions to trivalent cerium ions occurs, or with the temperature at which an oxygen deficiency occurs. This is because when the treatment time is too long for the single crystal size, the effect of the heat treatment will diminish, even if it is within 20 hours, and conversely, the light output will be adversely affected.

The preferred timing for applying the heat treatment method of the present invention (timing for starting the heating step) is one wherein after the grown crystal is cut and processed to the smallest predetermined dimensions, the effect of the present invention is easily obtained in a short time. However, it is possible to apply the heat treatment method of the present invention to an ingot if the crystal size of the unprocessed crystal ingot is relatively small. Moreover, the heat treatment method of the present invention may be applied in continuation with or partially overlapping with the cooling step subsequent to the crystal growth step of the Czochralski method and the like by an inline heating step in the growth furnace. In addition, in the case of crystal growth by the Czochralski method and the like, the heating step may be applied before removal of the crystal from the crystal melt.

The growth of crystals such as single crystals and the like that is performed prior to the heat treatment method of the present invention may be performed by conventional means. For example, it may be a single crystal growth method comprising a melting process step wherein a melt is obtained in which the starting material is prepared in a molten state through a melting method, and a cooling and solidifying process step in which a single crystal ingot is obtained by cooling and hardening of the melt.

The melting method of the aforementioned melting process step may be the Czochralski method. If this method is used, it is preferable to perform the melting process step and the cooling and solidifying process step using a crystal growth lifting apparatus 10 having the structure shown in FIG. 1.

FIG. 1 is a typical cross-sectional view illustrating one example of the basic structure of a growing apparatus for growing a single crystal in the present invention. The lifting apparatus 10 shown in FIG. 1 comprises a high-frequency induction heating furnace (2-zone heating growth furnace) 14. The high-frequency induction heating furnace 14 is one for performing operations in the aforementioned melting process step, and the cooling and solidifying process step sequentially.

In this high-frequency induction heating furnace 14 the refractory side walls form a cylindrical vessel with a bottom, and the shape per se of the cylindrical vessel with a bottom is similar to that used in single crystal growth based on the publicly known Czochralski method. A high frequency induction coil 15 is wrapped around the walls at the bottom of the high frequency induction furnace 14. In addition, a crucible 17 (for example, a crucible made of iridium) is arranged on the bottom within the high frequency induction furnace 14. This crucible 17 also serves as the high frequency induction thermal heater. In addition, when the single crystal starting material is placed into the crucible 17 and high frequency induction is applied to the high frequency induction coil 15, the crucible 17 is heated and a melt 18 comprising the constituent materials of the single crystal is obtained.

Moreover, a heater 13 (resistance thermal heater) is additionally positioned on the upper part of the inner wall surface such that does not come in contact with the melt 18 of the high frequency induction furnace 14. The thermal output of this heater can be controlled independently of the high frequency induction coil 15.

Furthermore, in the center of the bottom of the high frequency induction furnace 14 an opening (not illustrated) is provided that passes through to the exterior from the interior of the high frequency induction furnace 14. A crucible support rod 16 is inserted through this opening from the exterior of the high frequency induction furnace 14, and the tip of the crucible support rod 16 is in contact with the bottom of the crucible 17. By rotating this crucible support rod 16 it is possible to rotate the crucible 17 in the high frequency induction furnace 14. The space between the opening and the crucible support rod 16 is sealed with packing and the like.

Next the specific manufacturing method using the lifting apparatus 10 will be explained.

First, in the melting process step the single crystal starting material is placed in the crucible 17, and the melt 18 comprising the single crystal constituent materials is obtained by applying high frequency induction to the high frequency induction coil 15. Examples of single crystal starting material include, for example, single oxides and/or complex oxides of metal elements that constitute the single crystal. Ultrapure products from Shin-Etsu Chemical Co., Ltd., Stanford Material Corporation, Tama Chemicals Co., Ltd. and the like are preferred as commercial products.

Next, in the cooling and solidifying process step a cylindrical single crystal ingot 1 is obtained by cooling and solidifying the melt. More specifically, the operation is divided into two process steps, a crystal growing step and a cooling step that are described below.

First in the crystal growing step a pulling shaft 12 having a seed crystal 2 attached to the tip thereof is lowered into the melt 18 from the top of the high frequency induction furnace 14. Next, the single crystal ingot 1 is formed by withdrawing the pulling shaft 12. At this time the heating output of the heater 13 is adjusted during the crystal growing step so that the single crystal ingot 1 pulled from the melt 18 is grown until a cross-section thereof reaches a predetermined diameter.

Next, in the cooling step the thermal output of the heater is adjusted so that the grown single crystal ingot (not illustrated) obtained after the crystal growing step will cool.

The present invention concerns a single crystal heat treatment method that improves the light output of the aforementioned cerium-doped orthosilicate single crystals and the scintillator properties such as energy resolution and the like. The valence state of the cerium ions in the cerium-doped orthosilicate single crystal greatly affects light output. A change from the trivalent cerium ion state, which is a luminescent center, to a tetravalent cerium ion state, which causes coloration and fluorescent absorption, and becomes a non-luminescent center, occurs by heating the single crystal in an oxygen-containing atmosphere (for example, an atmosphere in which the oxygen concentration is 1 vol % or higher). Conversely, the cerium ions return to a trivalent state when the single crystal is heated in an oxygen-poor atmosphere (for example, an atmosphere in which the oxygen concentration is less than 0.2 vol %). In other words, the change between the trivalent and tetravalent state of cerium ions is a reversible change. In addition, the oxygen deficiency that occurs in cerium-doped orthosilicate single crystals affects the background intensity of light output. This oxygen deficiency increases variations such as differences within the light emitting crystals, differences between the ingots wherefrom they are obtained, and day-to-day variations and time-course changes due to exposure to natural light, including ultraviolet light, and the like. This oxygen deficiency is believed to be caused by crystal growth and/or cooling, or by heat treatment at a high temperature relatively close to the crystal melting point in an oxygen-poor atmosphere. The present invention inhibits the two actions of a valence shift in the cerium ions and the occurrence of an oxygen deficiency by the conditions of the atmosphere and the heating temperature (temperature T) in the heating step. Thus, the present invention provides a method for improving scintillator properties thereby. However, the effect of the present invention is not limited to the aforementioned phenomena.

In accordance with the present invention single crystals of the cerium-doped silicate compounds represented by general formulas (1), (2), and (6) above can achieve a stable, high level of light output and have extremely little variation due to differences within single crystals, differences between ingots wherefrom they are obtained, and day-to-day variations and time-course changes due to exposure to natural light, including ultraviolet light, and the like. Similar benefits can be obtained with these single crystals even when they use at least one elemental species selected from a group comprising Dy, Ho, Er, Tm, Yb, Lu, Y, and Sc, which have an ionic radius smaller than Tb, as Ln.

EXAMPLES

The present invention is described in greater detail below through examples, but the present invention is by no means limited to these examples.

Example 1

Single crystals were manufactured based on the publicly known Czochralski method. First, as starting material for a $Gd_{2-(r+s)}Lu_rCe_sSiO_5$ (r=0.4, s=0.02) single crystal, 5400 g of a mixture of gadolinium oxide ($Gd_2O_3$, 99.99 wt % purity), lutetium oxide ($Lu_2O_3$, 99.99 wt % purity), silicon dioxide ($SiO_2$, 99.9999 wt % purity), and cerium oxide ($CeO_2$, 99.99 wt % purity) that matched the specified stoichiometric composition was placed in an iridium crucible 110 mm in diameter, 110 mm tall and 3 mm thick. Next, the mixture was heated to its melting point (approximately 1980° C.) in the high frequency induction furnace and melted to obtain a melt. The melting point was measured with an electronic optical pyrometer (Chino Corporation, Pyrostar® Model UR-U).

Next, the tip of the pulling shaft having a seed crystal attached thereto was lowered into the melt and seeding was performed. Next, the neck section was formed by pulling the single crystal ingot at a pull rate of 1.5 mm/h. Thereafter, pulling of the cone section was performed, and when a diameter of 60 mm was reached, pulling of the body was initiated at a pull rate of 1 mm/h. After the body had been grown, the single crystal ingot was freed from the melt and cooling was initiated. During crystal growth nitrogen gas with a flow rate of 4 L/min and oxygen gas with a flow rate of 2 mL/min was streamed continuously within the growth furnace.

After cooling was completed the single crystal obtained thereby was removed from the furnace. The single crystal ingot weighed approximately 3500 g, the length of the cone section was approximately 40 mm, and the length of the body section was approximately 170 mm. A plurality of rectangular crystal samples measuring 2 mm×2 mm×15 mm were cut from the single crystal ingot.

Two crystal samples were selected arbitrarily from the plurality of crystal samples and placed in the iridium crucible. Next, in the heating step the temperature in the iridium crucible was raised to 1200° C. over approximately 2 to 3 hours in an oxygen-poor nitrogen atmosphere (oxygen concentration: 100 vol ppm or less). After the temperature was maintained for 6 hours, the samples were cooled to room temperature over approximately 8 to 12 hours. The oxygen concentration was measured by a zirconia sensor (Tohken Co., Ltd., ECOAZ-CG® $O_2$ ANALYZER). A nitrogen atmosphere was maintained in the interior of the furnace used for heating the iridium crucible by a stream of nitrogen gas at a flow rate of 4 L/min.

Next, chemical etching was performed on the crystal samples before and after the heating step with phosphoric acid, and the entire surface of the sample crystals was given a mirror finish. One of the 2 mm×2 mm surfaces (hereinafter, referred to as the "radiation incident surface") the among the 6 surfaces on the 2 mm×2 mm×15 mm rectangular crystal samples was excluded, and the remaining 5 surfaces were coated with polytetrafluoroethylene (PTFE) tape as a reflective material. Next, the aforementioned radiation incident surface of each sample, which was not coated with the PTFE tape, was immobilized on the photomultiplying plane (photoelectric conversion plane) in a photomultiplier tube (Hamamatsu Photonics, R878) using optical grease. Then, the light output and energy resolution of each sample was evaluated by irradiating each sample with gamma radiation of 611 KeV using $^{137}Cs$ and measuring the energy spectrum of each sample. The energy spectrum was measured when a voltage of 1.45 kV was applied to the photomultiplier tube, the signal from the dynode was amplified by a preamplifier (ORTEC® Model 113) and a waveform shaping amplifier (ORTEC® Model 570), and measured with a multichannel analyzer (MCA) (PGT, Quantum MCA4000®). The results are shown in Table 1 and 2.

TABLE 1

| | | | Heating step conditions | | | | |
| --- | --- | --- | --- | --- | --- | --- | --- |
| | Crystal composition | Growing atmosphere | Atmosphere | Temperature T(° C.) | Duration (hr) | Light output (ch) | Energy resolution (%) |
| Example 1 | $Gd_{2-(r+s)}Lu_rCe_sSiO_5$ (r = 0.4, s = 0.02) | $N_2/O_2$ ($O_2$: 500 volppm) | $N_2/O_2$ ($O_2$: 100 volppm or lower) | 1200 | 6 | 668 671 | 10.8 10.6 |
| Example 2 | | | | | 12 | 636 644 | 10.0 11.6 |
| Example 3 | | | | 1400 | 1 | 579 638 | 11.2 11.3 |

TABLE 1-continued

| | Crystal composition | Growing atmosphere | Atmosphere | Temperature T(° C.) | Duration (hr) | Light output (ch) | Energy resolution (%) |
|---|---|---|---|---|---|---|---|
| Example 4 | | | | | 3 | 657 | 11.7 |
| | | | | | | 671 | 11.4 |
| Example 5 | | | | | 6 | 576 | 10.8 |
| | | | | | | 590 | 11.0 |
| Comparative Example 1 | | | | 1500 | 3 | Not measurable | |
| | | | | | | Not measurable | |
| Before heating step | | | | — | | 557 | 11.4 |
| | | | | | | 586 | 10.8 |

TABLE 2

| | Crystal composition | Growing atmosphere | Atmosphere | Temperature T(° C.) | Duration (hr) | Light output (ch) | Energy resolution (%) |
|---|---|---|---|---|---|---|---|
| Example 6 | $Gd_{2-(r+s)}Lu_rCe_sSiO_5$ (r = 1.8, s = 0.0005) | $N_2/O_2$ ($O_2$: 0.25 vol %) | $N_2/O_2$ ($O_2$: 100 volppm or lower) | 1200 | 12 | 1190 | 13.6 |
| | | | | | | 1195 | 11.7 |
| Before heating step | | | | — | | 1112 | 14.9 |
| | | | | | | 1121 | 12.3 |
| Example 7 | $Gd_{2-(r+s)}Lu_rCe_sSiO_5$ (r = 1.8, s = 0.002) | $N_2/O_2$ ($O_2$: 0.25 vol %) | $N_2/O_2$ ($O_2$: 100 volppm or lower) | 1200 | 12 | 929 | 12.3 |
| | | | | | | 1107 | 15.3 |
| Before heating step | | | | — | | 909 | 20.4 |
| | | | | | | 942 | 15.2 |
| Example 8 | $Y_{2-(x+y)}Lu_xCe_ySiO_5$ (x = 1.8, y = 0.003) | $N_2/O_2$ ($O_2$: 0.25 vol %) | $N_2/O_2$ ($O_2$: 100 volppm or lower) | 1200 | 12 | 1067 | 12.8 |
| | | | | | | 1132 | 11.5 |
| Before heating step | | | | — | | 943 | 14.5 |
| | | | | | | 958 | 13.8 |
| Comparative Example 2 | $Gd_{2-(r+s)}Lu_rCe_sSiO_5$ (r = 0.4, s = 0.02) | $N_2/O_2$ ($O_2$: 500 volppm) | Air atmosphere | 1300 | 5 | 260 | 13.0 |
| | | | | | | 277 | 12.5 |
| Before heating step | | | | — | | 502 | 11.3 |
| | | | | | | 380 | 10.3 |

Example 2

Samples were prepared in the same manner as Example 1 except in the heating step the time at which 1200° C. was maintained was changed from 6 hours to 12 hours.

Example 3

Samples were prepared in the same manner as Example 1 except in the heating step 1200° C. was maintained for 6 hours and 1400° C. for 1 hour.

Example 4

Samples were prepared in the same manner as Example 1 except in the heating step 1200° C. was maintained for 6 hours and 1400° C. for 3 hours.

Example 5

Samples were prepared in the same manner as Example 1 except in the heating step 1200° C. was maintained for 6 hours and 1400° C. for 6 hours.

Example 6

Samples were prepared in the same manner as Example 1 except in place of the $Gd_{2-(r+s)}Lu_rCe_sSiO_5$ (r=0.4, s=0.02) single crystal, a $Gd_{2-(r+s)}Lu_rCe_sSiO_5$ (r=1.8, s=0.0005) single crystal was formed, the $O_2$ gas flow rate during the crystal growing process was changed from 2 mL/min to 10 mL/min, the size of the crystal samples was changed from 2 mm×2 mm×15 mm to 4 mm×6 mm×20 mm, the size of the radiation incident surface was changed from 2 mm×2 mm to 4 mm×6 mm, and the time at which 1200° C. was maintained during the heating step was changed from 6 hours to 12 hours. Moreover, the melting point during growth was approximately 2080° C.

Example 7

Samples were prepared in the same manner as Example 1 except in place of the $Gd_{2-(r+s)}Lu_rCe_sSiO_5$ (r=0.4, s=0.02) single crystal, a $Gd_{2-(r+s)}Lu_rCe_sSiO_5$ (r=1.8, s=0.002) single crystal was formed, the $O_2$ gas flow rate during the crystal growing process was changed from 2 ml/min to 10 mL/min, the size of the crystal samples was changed from 2 mm×2 mm×15 mm to 4 mm×6 m×20 mm, the size of the radiation incident surface was changed from 2 mm×2 mm to 4 mm×6 mm, and the time at which 1200° C. was maintained during the heating step was changed from 6 hours to 12 hours. Moreover, the melting point during growth was approximately 2080° C.

Example 8

Samples were prepared in the same manner as Example 1 except in place of the $Gd_{2-(r+s)}Lu_rCe_sSiO_5$ (r=0.4, s=0.02) single crystal, a $Y_{2-(x+y)}Lu_xCe_ySiO_5$ (x=1.8, y=0.003) single crystal was formed, the $O_2$ gas flow rate during the crystal growing process was changed from 2 mL/min to 10 mL/min, the size of the crystal samples was changed from 2 mm×2 mm×15 mm to 4 mm×6 mm×20 mm, the size of the radiation incident surface was changed from 2 mm×2 mm to 4 mm×6 mm, and the time at which 1200° C. was maintained during the heating step was changed from 6 hours to 12 hours. Moreover, the melting point during growth was approximately 2080° C.

Comparative Example 1

Samples were prepared in the same manner as Example 1 except in the heating step 1200° C. was maintained for 6 hours and 1500° C. for 3 hours.

Comparative Example 2

Samples were prepared in the same manner as Example 1 except in the heating step 1200° C. was maintained for 6 hours in an oxygen-poor nitrogen atmosphere (oxygen concentration: 100 vol ppm or less) and 1300° C. for 5 hours in an air atmosphere (oxygen content: approximately 21 vol %).

Table 1 and 2 shows the results of light output and energy resolution for the crystal samples from Examples 2-8 and Comparative Examples 1 and 2. The entries in Table 1 and 2 of "not measurable" mean that accurate measurements of light output and energy resolution could not be made because the background was too high.

The following points are clear from Table 1 and 2. It is clear that light output and energy resolution are all greater than before the heating step. It is believed that the scintillator properties are improved because the cerium ions are reduced from the tetravalent form to the trivalent form and the coloration is reduced because the heat treatment was performed in a nitrogen atmosphere.

It is believed that the background was too high and the light output and the like could not be measured in Example 1 because an oxygen deficiency occurred at the heat treatment temperature of 1500° C. It is believed that the coloration was increased and scintillator properties were diminished in Comparative Example 2 by the oxidation of trivalent cerium ions to the tetravalent form because the heat treatment was performed in air.

What is claimed is:

1. A single crystal heat treatment method, comprising a step of heating a single crystal of a cerium-doped silicate compound represented by general formula (1) or (2) below in an atmosphere containing an oxygen concentration of 300 vol ppm or less, at a temperature $T_1$ (units: ° C.) that satisfies the conditions represented by formula (3) below and at a time of from 1 to 20 hours $$Y_{2-(x+y)}Ln_xCe_ySiO_5 \qquad (1)$$

(wherein Ln represents at least one elemental species selected from a group consisting of elements belonging to the rare earth elements, x represents a numerical value from 0 to 2, and y represents a numerical value greater than 0 but less than or equal to 0.2)

$$Gd_{2-(z+w)}Ln_zCe_wSiO_5 \qquad (2)$$

(wherein Ln represents at least one elemental species selected from a group consisting of elements belonging to the rare earth elements, z represents a numerical value greater than or equal to 0.4 but less than or equal to 2, and w represents a numerical value greater than 0 but less than or equal to 0.2)

$$800 \leq T_1 \leq (T_{m1}-580) \qquad (3)$$

(wherein $T_{m1}$ (units: ° C.) represents the melting point of the single crystal), and wherein prior to said step of heating a single crystal of a cerium-doped silicate compound the single crystal is grown or cooled in an oxygen-containing atmosphere, or is heated in an oxygen-containing atmosphere.

2. A single crystal heat treatment method, comprising a step of heating a single crystal of a cerium-doped gadolinium silicate compound represented by general formula (4) below in an atmosphere containing an oxygen concentration of 300 vol ppm or less, at a temperature $T_2$ (units: ° C.) that satisfies the conditions represented by formula (5) below and an time of from 1 to 20 hours $$Gd_{2-(p+q)}Ln_pCe_qSiO_5 \qquad (4)$$

(wherein Ln represents at least one elemental species selected from a group consisting of Dy, Ho, Er, Tm, Yb, Lu, Y and Sc, which are rare earth elements having an ionic radius smaller than Tb, p represents a numerical value greater than or equal to 0.4 but less than or equal to 2, and q represents a numerical value greater than 0 but less than or equal to 0.2)

$$800 \leq T_2 \leq (T_{m2}-580) \qquad (5)$$

(wherein T (units: ° C.) represents the melting point of the single crystal), and wherein prior to said step of heating a single crystal of a cerium-doped silicate compound the single crystal is grown or cooled in an oxygen-containing atmosphere, or is heated in an oxygen-containing atmosphere.

3. A single crystal heat treatment method, comprising a step of heating a single crystal of a cerium-doped gadolinium silicate compound represented by general formula (6) below in an containing an oxygen concentration of 300 vol ppm or less, atmosphere at a temperature $T_3$ (units: ° C.) that satisfies the conditions represented by formula (7) below and at a time of from 1 to 20 hours $$Gd_{2-(r+s)}Lu_rCe_sSiO_5 \qquad (6)$$

(wherein r represents a numerical value greater than or equal to 0.4 but less than or equal to 2, and s represents a numerical value greater than 0 but less than or equal to 0.2)

$$800 \leq T_3 \leq (T_{m3}-580) \qquad (7)$$

(wherein $T_{m3}$ (units: ° C.) represents the melting point of the single crystal), and wherein prior to said step of heating a single crystal of a cerium-doped silicate compound the single crystal is grown or cooled in an oxygen-containing atmosphere, or is heated in an oxygen-containing atmosphere.

4. The single crystal heat treatment method according to any one of claims 1-3, wherein the oxygen-poor atmosphere contains hydrogen gas as a reducing gas in a concentration of 0.5 vol % or greater.

5. The single crystal heat treatment method of claim 1, wherein the grown crystal is cut and processed to a predetermined dimension prior to said step of heating a single crystal of a cerium-doped silicate compound.

6. The single crystal heat treatment method according to claim 1, wherein said temperature $T_1$ also satisfies the relationship 1,200° C. $\leq T_1 \leq$ 1,400° C.

7. The single crystal heat treatment method according to claim 2, wherein said temperature $T_2$ also satisfies the relationship 1,200° C. $\leq T_2 \leq$ 1,400° C.

8. The single crystal heat treatment method according to claim 3, wherein said temperature $T_3$ also satisfies the relationship $1{,}200°\,C. \le T_3 \le 1{,}400°\,C.$

* * * * *